United States Patent
Takahashi et al.

(10) Patent No.: US 7,397,177 B2
(45) Date of Patent: Jul. 8, 2008

(54) LED LAMP AND METHOD FOR MANUFACTURING THE SAME

(75) Inventors: Kiyoshi Takahashi, Kyotanabe (JP); Masanori Shimizu, Kyotanabe (JP); Tadashi Yano, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 497 days.

(21) Appl. No.: 10/932,417

(22) Filed: Sep. 2, 2004

(65) Prior Publication Data

US 2005/0146879 A1 Jul. 7, 2005

(30) Foreign Application Priority Data

Sep. 25, 2003 (JP) .............................. 2003-333211

(51) Int. Cl.
*H01J 1/62* (2006.01)

(52) U.S. Cl. ....................................... 313/501; 313/498

(58) Field of Classification Search ......... 313/498–501; 257/98–100

See application file for complete search history.

(56) References Cited

U.S. PATENT DOCUMENTS

| 5,043,716 | A  | * | 8/1991 | Latz et al. ...................... 345/82 |
| 2002/0021085 | A1 | * | 2/2002 | Ng ............................... 313/499 |
| 2003/0067264 | A1 | * | 4/2003 | Takekuma ................... 313/501 |
| 2004/0100192 | A1 |   | 5/2004 | Yano et al. |
| 2004/0119086 | A1 |   | 6/2004 | Yano et al. |
| 2004/0124430 | A1 |   | 7/2004 | Yano et al. |
| 2004/0211970 | A1 | * | 10/2004 | Hayashimoto et al. ......... 257/98 |

FOREIGN PATENT DOCUMENTS

JP 10-065221 B2 3/1998

* cited by examiner

*Primary Examiner*—Vip Patel
(74) *Attorney, Agent, or Firm*—Panitch Schwarze Belisario & Nadel LLP

(57) ABSTRACT

An LED lamp includes at least one LED chip mounted on the principal surface of a substrate and an optical wavelength converting portion, which includes a phosphor for converting the emission of the LED chip into light having a longer wavelength than that of the emission and which covers at least a portion of the LED chip. The side surface of the optical wavelength converting portion has at least one concave curved surface portion.

15 Claims, 10 Drawing Sheets

EMISSION POINT 2    EMISSION POINT 1

LED LAMP AND METHOD FOR MANUFACTURING THE SAME

BACKGROUND OF THE INVENTION

1. Field of the Invention

The present invention relates to an LED lamp in which at least a portion of the radiation produced by an LED chip is subjected to a wavelength conversion with a phosphor.

2. Description of the Related Art

White LED lamps are recently under vigorous research and development. When LED chips are used as a lamp, blue-emitting LED chips are sometimes coated with a yellow-emitting phosphor to obtain color white that is suitable for illumination purposes (see Japanese Patent Publication No. 2998696, for example). In this manner, white light can be extracted as synthesized light by subjecting a portion of the radiation produced by the LED chips to a wavelength conversion with the phosphor. More specifically, a blue LED chip, made of gallium nitride (GaN), is coated with a phosphor such as YAG. In such an LED lamp, the blue LED chip produces an emission with a wavelength of about 450 nm, and the phosphor produces yellow fluorescence with a peak wavelength of about 550 nm on receiving that emission. Eventually, the emission and fluorescence mix with each other, thereby providing white light.

The present inventors completed an invention of dissipating the heat, generated by an LED chip, into a substrate by directly mounting the LED chip on the substrate and disclosed the invention in Japanese Laid-Open Publication No. 2004-172586. FIG. 3 is a cross-sectional view of the LED lamp 300 disclosed in Japanese Laid-Open Publication No. 2004-172586. In this LED lamp 300, an LED chip 12 provided on a substrate 11 is covered with a cylindrical resin portion 60 containing a phosphor. The cylindrical resin portion 60 is further covered with a second resin portion 61. The cylindrical resin portion 60 functions as an optical wavelength converting portion. And the light 62 is radiated outward through the second resin portion 61.

However, the present inventors discovered, as a result of further researches, that the luminous flux of the LED lamp changed significantly when the shape of the cylindrical resin portion 60, containing the phosphor, was changed.

SUMMARY OF THE INVENTION

In order to overcome the problems described above, an object of the present invention is to provide an LED lamp, which can extract light from its LED chip and phosphor more efficiently and obtain an increased luminous flux by adjusting the shape of its optical wavelength converting portion made of a resin containing the phosphor.

An LED lamp according to a preferred embodiment of the present invention preferably includes at least one LED chip mounted on the principal surface of a substrate and an optical wavelength converting portion, which includes a phosphor for converting the emission of the LED chip into light having a longer wavelength than that of the emission and which covers at least a portion of the LED chip. The side surface of the optical wavelength converting portion preferably has at least one concave curved surface portion.

In one preferred embodiment of the present invention, the LED lamp preferably further includes a cover member that covers at least a part of the optical wavelength converting portion.

In another preferred embodiment, the LED lamp preferably further includes a reflective surface, which is spaced apart from the side surface of the optical wavelength converting portion, and a cover member that covers at least a part of the optical wavelength converting portion. The refractive index of the cover member is different from that of the optical wavelength converting portion.

In this particular preferred embodiment, the refractive index of the cover member is preferably greater than that of the optical wavelength converting portion.

More specifically, the cover member is preferably made of a resin, and preferably fills a gap between the side surface of the optical wavelength converting portion and the reflective surface.

In a specific preferred embodiment, the cover member preferably functions as a lens.

In still another preferred embodiment, the optical wavelength converting portion is preferably made of a resin including the phosphor.

In yet another preferred embodiment, as viewed on a plane perpendicular to the principal surface of the substrate, a cross section of the optical wavelength converting portion, taken across the concave curved surface portion of its side surface, preferably has a profile including a curve that defines the concave curved surface portion, and R/t, obtained by dividing the radius of curvature R of the curves by the thickness t of the optical wavelength converting portion, is from 0.5 to 8.5.

In yet another preferred embodiment, d/t, obtained by dividing the depth d of the concave curved surface portion on the side surface of the optical wavelength converting portion by the thickness t of the optical wavelength converting portion, is preferably from 0.03 to 0.5.

In a specific preferred embodiment, the depth d of the concave curved surface portion on the side surface of the optical wavelength converting portion is preferably from 0.01 mm to 0.17 mm.

In yet another preferred embodiment, the optical wavelength converting portion may have a substantially cylindrical shape, of which the side surface may define the concave curved surface portion.

In an alternative preferred embodiment, the optical wavelength converting portion may substantially have the shape of a truncated cone, of which the side surface may define the concave curved surface portion.

An LED lamp according to another preferred embodiment of the present invention preferably includes a plurality of LED chips, a plurality of reflective surfaces, a plurality of optical wavelength converting portions and a plurality of cover members. The LED chips are preferably arranged on the principal surface of a substrate. Each of the reflective surfaces preferably surrounds the side surface of an associated one of the LED chips. Each of the optical wavelength converting portions preferably includes a phosphor for converting the emission of its associated LED chip into light having a longer wavelength than that of the emission and preferably covers the associated LED chip. Each of the cover members preferably covers an associated one of the optical wavelength converting portions. The side surface of each optical wavelength converting portion preferably has at least one concave curved surface portion. Each cover member preferably fills a gap between the side surface of its associated optical wavelength converting portion and its associated reflective surface.

A printing stencil according to a preferred embodiment of the present invention is used to form a resin pattern on a substrate. The stencil preferably includes a plate member that has an upper surface, a lower surface and at least one through hole that connects the upper and lower surfaces together. At least while a resin filling the through hole is being cured, the inner wall of the through hole in the plate member preferably defines a convex curved surface that is raised toward the center of the through hole.

In one preferred embodiment of the present invention, the plate member is preferably made of a material that changes its shape flexibly in response to external force.

In this particular preferred embodiment, the plate member is preferably made of an elastic material.

In another preferred embodiment, the printing stencil may further include a plate that contacts with at least one of the upper and lower surfaces of the plate member.

An LED lamp manufacturing method according to a preferred embodiment of the present invention preferably includes the steps of (A) mounting at least one LED chip on the principal surface of a substrate and (B) providing an optical wavelength converting portion on the substrate. The optical wavelength converting portion preferably includes a phosphor that converts the emission of the LED chip into light having a longer wavelength than that of the emission and preferably covers at least a portion of the LED chip. The step (B) preferably includes the step of forming at least one concave curved surface portion on the side surface of the optical wavelength converting portion.

In one preferred embodiment of the present invention, the step (B) preferably includes the steps of (b1) providing an isolated pattern of the material of the optical wavelength converting portion on the substrate and (b2) forming the concave curved surface portion by deforming the side surface of the isolated pattern.

In an LED lamp according to any of various preferred embodiments of the present invention, the side surface of an optical wavelength converting portion, including a phosphor, has a concave curved surface portion. As a result, light can be extracted from the LED chip and phosphor more efficiently and the luminous flux increases.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, an LED lamp according to a preferred embodiment of the present invention will be described with reference to the accompanying drawings.

Figure 1:
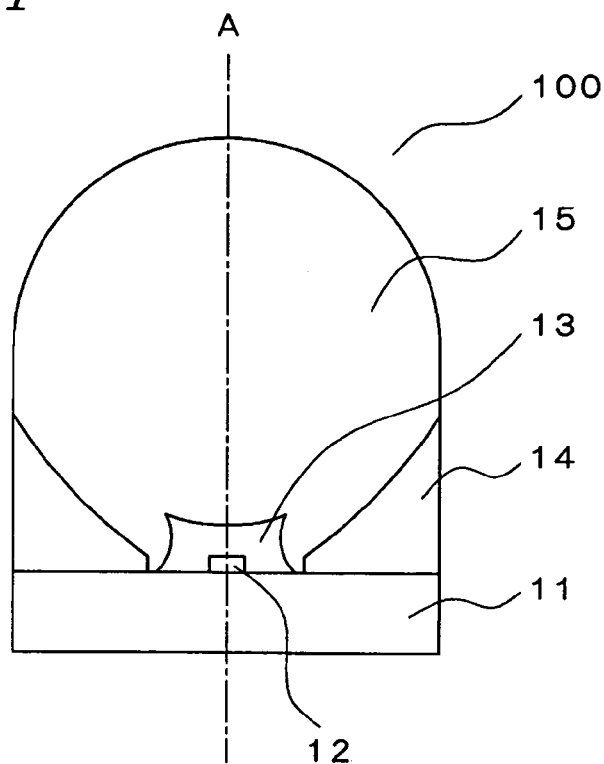
FIG. 1 is a schematic cross-sectional view of an LED lamp 100 according to a preferred embodiment of the present invention.

First, referring to FIG. 1, illustrated is a cross section of an LED lamp 100 according to a first specific preferred embodiment of the present invention.

As shown in FIG. 1, the LED lamp 100 preferably includes a substrate 11, a blue LED chip 12, which is flip-chip bonded onto the principal surface (i.e., the upper surface) of the substrate 11, and an optical wavelength converting portion 13, which covers the LED chip 12. In FIG. 1, just one LED chip 12 and only one optical wavelength converting portion 13, which covers the LED chip 12 entirely, are illustrated for the sake of simplicity. Actually, however, the LED lamp 100 preferably includes a plurality of LED chips 12, which are arranged in a two-dimensional array on the principal surface of the substrate 11, and a plurality of optical wavelength converting portions 13, each of which covers an associated one of the LED chips 12. Nevertheless, according to the principle of the present invention, the LED lamp 100 can work just by providing one LED chip and its associated optical wavelength converting portion on the same substrate. Alternatively, a single optical wavelength converting portion 13 may cover a plurality of LED chips as well.

Although not shown in FIG. 1, interconnects are preferably provided on the substrate 11 and are electrically connected to the LED chip 12 by way of electrode pads, for example. Thus, current is supplied from a lighting circuit (not shown) to the LED chip 12, thereby producing light in the LED chip 12. The substrate 11 with those interconnects may have a multilevel interconnect structure. If a number of LED chips 12 are mounted thereon, the substrate 11 is preferably a metal composite substrate with a good heat dissipation property.

The optical wavelength converting portion 13 is made of a resin including a phosphor for converting the blue emission of the blue LED chip 12 into yellow light. Examples of such phosphors include $(Y.Sm)_3(Al.Ga)_5O_{12}$: Ce and $(Y_{0.39}Gd_{0.57}Ce_{0.03}Sm_{0.01})_3Al_5O_{12}$. The resin as the optical wavelength converting portion 13 may include a silicone resin as its main ingredient and may have a refractive index of about 1.4. The optical wavelength converting portion 13 is preferably translucent (or partially transparent). However, the optical wavelength converting portion 13 can be fully transparent.

As described above, a blue-ray-emitting LED chip is used in this preferred embodiment. However, the present invention is in no way limited to that specific preferred embodiment. Alternatively, an LED chip having a peak wavelength in any other wavelength range may be used instead. In that case, however, the type of the phosphor included in the optical wavelength converting portion needs to be either changed or adjusted appropriately. It should be noted that the phosphor to be included does not have to be one but multiple types of phosphors may be included in the same optical wavelength converting portion. Alternatively, different types of phosphors may be used for respective LED chips on the same substrate. Optionally, multiple types of LED chips with mutually different peak wavelengths may be arranged on the same substrate.

The prime feature of this preferred embodiment lies in the side surface shape of the optical wavelength converting portion 13 but this point will be described fully later after the other members shown in FIG. 1 are described.

In the LED lamp 100 of this preferred embodiment, a reflector 14 with a reflective surface is provided on the principal surface of the substrate 11. The reflector 14 is provided so as to receive the light that has been radiated from each LED chip 12 and its associated optical wavelength converting portion 13 and reflect the light perpendicularly to the principal surface of the substrate 11. The reflector 14 is preferably a metal plate with a plurality of openings and the inner surface of each of those openings functions as the reflective surface. In FIG. 1, only a portion of the reflector 14 is illustrated as having a parabolic reflective surface. The reflector 14 may be made of aluminum (Al), for example.

This embodiment is characterized by spacing the reflective surface of the reflector 14 from the side surface of the optical wavelength converting portion 13. Specifically, the gap provided between the reflective surface of the reflector 14 and the side surface of the optical wavelength converting portion 13 may have a size of 100 μm to 10 mm, for example.

The optical wavelength converting portion 13 is covered with a cover member 15, which is preferably made of a resin, for example. In this preferred embodiment, the cover member 15 functions as a convex lens and consists essentially of an epoxy resin. The cover member 15 is fully or partially transparent and has a refractive index n2 of about 1.6 (i.e., n2>n1). The "gap" between the reflective surface of the reflector 14 and the side surface of the optical wavelength converting portion 13 is filled with the cover member 15. Accordingly, the light that has been produced in the LED chip 12 or in the optical wavelength converting portion 13 is transmitted through the interface between the optical wavelength converting portion 13 and the cover member 15 and then reflected from the reflective surface of the reflector 14.

The overall structure shown in FIG. 1, except the LED chip 12, is asymmetric with respect to the one-dot chain A. The LED chip 12 typically has a rectangular parallelepiped shape and may have a thickness of about 60 μm. The upper surface of the LED chip 12 may be a rectangle with dimensions of 0.3 mm×0.3 mm.

In this preferred embodiment, the LED chip 12 is flip-chip bonded and therefore no lead wires are needed. Accordingly, the optical wavelength converting portion 13 including the phosphor can be provided easily. A preferred method of forming the optical wavelength converting portion 13 will be described later.

Next, it will be described how the LED lamp 100 shown in FIG. 1 operates.

A portion of the emission of the LED chip 12 is absorbed into the phosphor in the optical wavelength converting portion 13 and then radiated from the phosphor as light with a longer wavelength (i.e., yellow light). This is what we call "wavelength conversion". As a result, a mixture of the blue ray radiated from the LED chip 12 and the yellow light, i.e., white light, is radiated outward through the surface of the optical wavelength converting portion 13. This white light leaves the LED lamp 100 by way of the cover member 15. Thus, due to the lens effect caused by the cover member 15, the white light is subjected to converging action. As described above, a portion of the light going out through the surface of the optical wavelength converting portion 13 is not absorbed into the optical wavelength converting portion of an adjacent LED chip (not shown) but reflected from the reflector 14. Consequently, compared with the situation where no reflectors 14 are provided, the optical efficiency (i.e., light extraction efficiency) improves.

Figure 2:
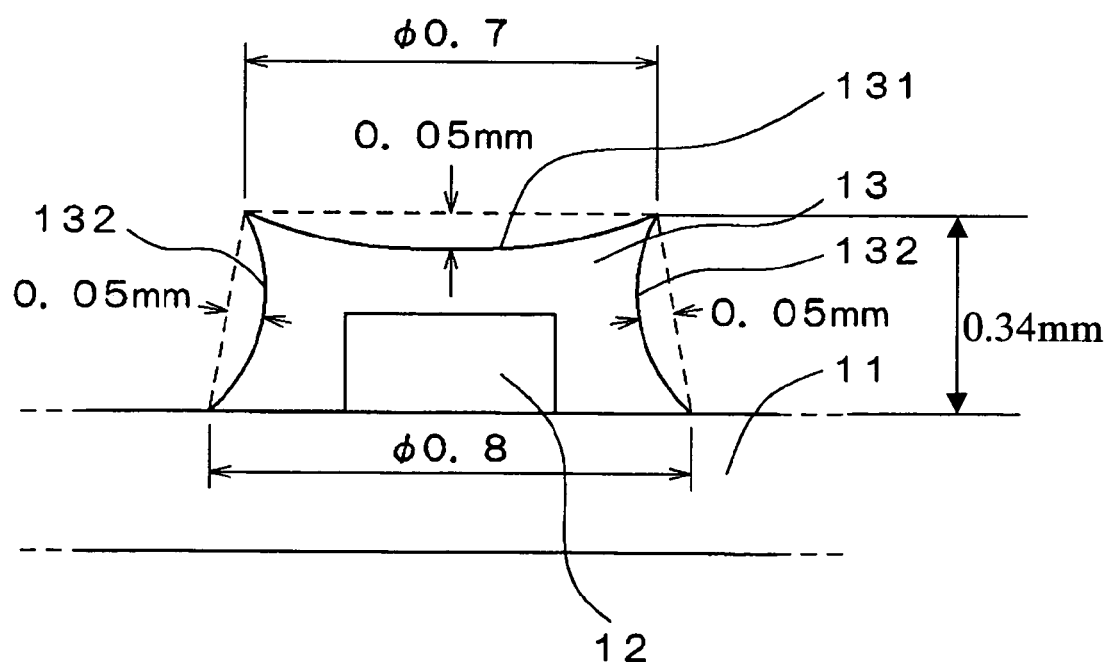
FIG. 2 is a cross-sectional view illustrating the optical wavelength converting portion 13 of the LED lamp 100 on a larger scale.

Hereinafter, the preferred shape of the optical wavelength converting portion 13 will be described in detail with reference to FIG. 2, which is a cross-sectional view illustrating the details of the optical wavelength converting portion 13 shown in FIG. 1 on a larger scale. In FIG. 2, the illustration of the cover member 15 and reflector 14 is omitted for the sake of simplicity.

As shown in FIG. 2, the optical wavelength converting portion 13 of this preferred embodiment substantially has the shape of a truncated cone, the bottom of which is in contact with the principal surface of the substrate 11. In this preferred embodiment, both the upper surface 131 (i.e., a surface of the first resin portion facing the substrate 11) and the side surface 132 (i.e., a surface other than the bottom contacting with the principal surface of the substrate 11 and the upper surface 131) of the optical wavelength converting portion 13 have a concave curved surface portion as shown in FIG. 2. As used herein, to be "concave" refers to the shape of the optical wavelength converting portion 13, of which the surfaces are recessed toward the LED chip 12.

Figure 12:
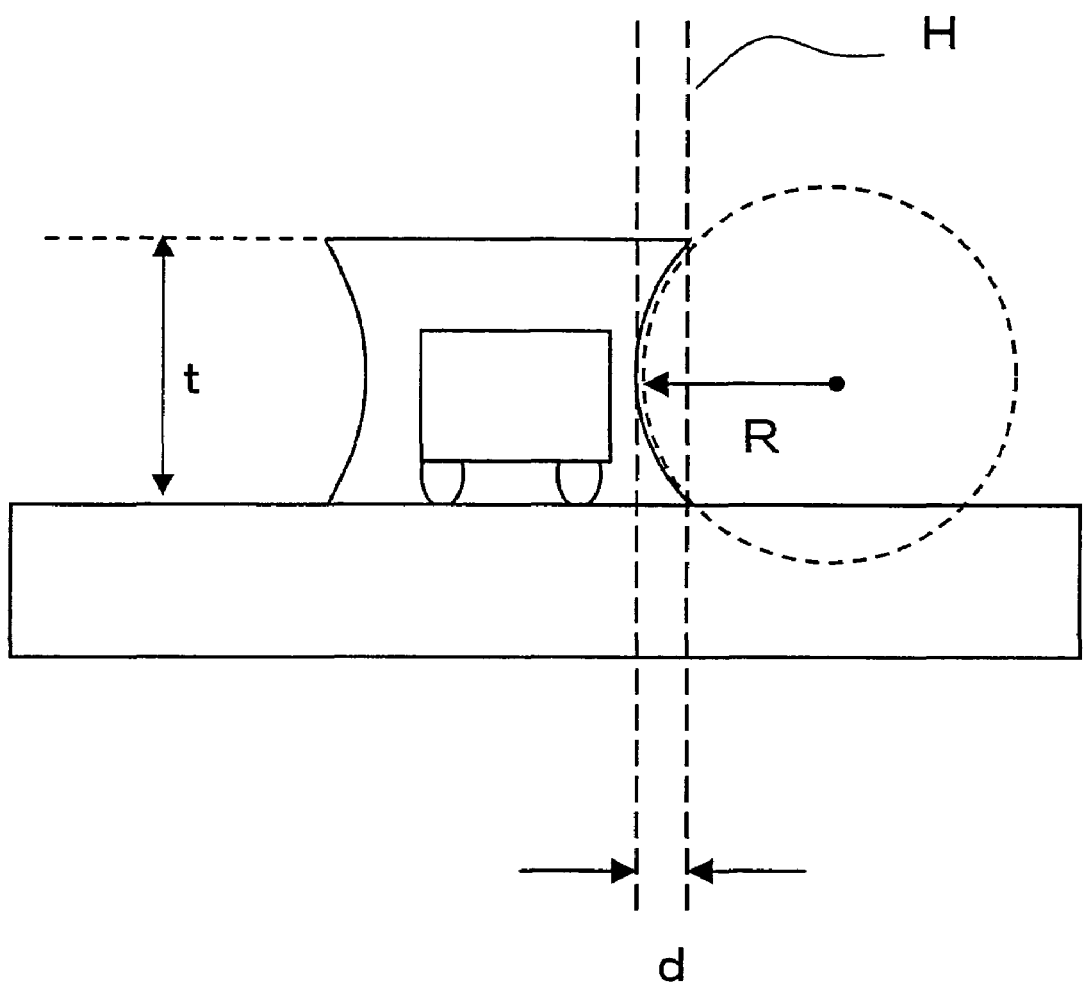
FIG. 12 schematically shows a number of parameters that define the shape of the concave curved surface portion of the optical wavelength converting portion.

FIG. 12 shows a number of parameters that define the shape of the concave curved surface portion on the side surface of the optical wavelength converting portion. The optical wavelength converting portion illustrated in FIG. 12 is supposed to have a substantially cylindrical shape and a flat upper surface for the sake of simplicity. In FIG. 12, a virtual side surface that the optical wavelength converting portion would have without the concave curved surface portion (which will be referred to herein as a "reference surface") is indicated by the dashed line H. The distance d between the reference surface and a point on the concave curved surface portion, which is most distant from the reference surface (i.e., a deepest point), will be referred to herein as the "depth of the concave curved surface portion". It should be noted that the line defining this distance (or depth) d is a normal (i.e., perpendicular) to the reference surface H that passes that deepest point.

FIG. 12 also shows the radius of curvature R of the concave curved surface portion and the height t of the optical wavelength converting portion. The shape of the concave curved surface portion can be characterized by these parameters d, R and t.

Referring back to FIG. 2, the upper surface 131 of the optical wavelength converting portion 13 has a diameter of about 0.7 mm and its bottom has a diameter of about 0.8 mm. The concave portions of the upper and side surfaces 131 and 132 both have a depth of 0.05 mm as measured from the surface of the virtual truncated cone represented by the dashed line in FIG. 2. As described above, the optical wavelength converting portion 13 is axisymmetric with respect to the dashed line A shown in FIG. 1.

A typical concave curved surface portion is preferably a smooth curved surface but may have microscopic unevenness with a surface roughness Ra of about 0.2×d or less.

Figure 7A:
FIGS. 7A and 7B are photographs showing specific examples of the optical wavelength converting portion 13 made of a resin.
Figure 7B:
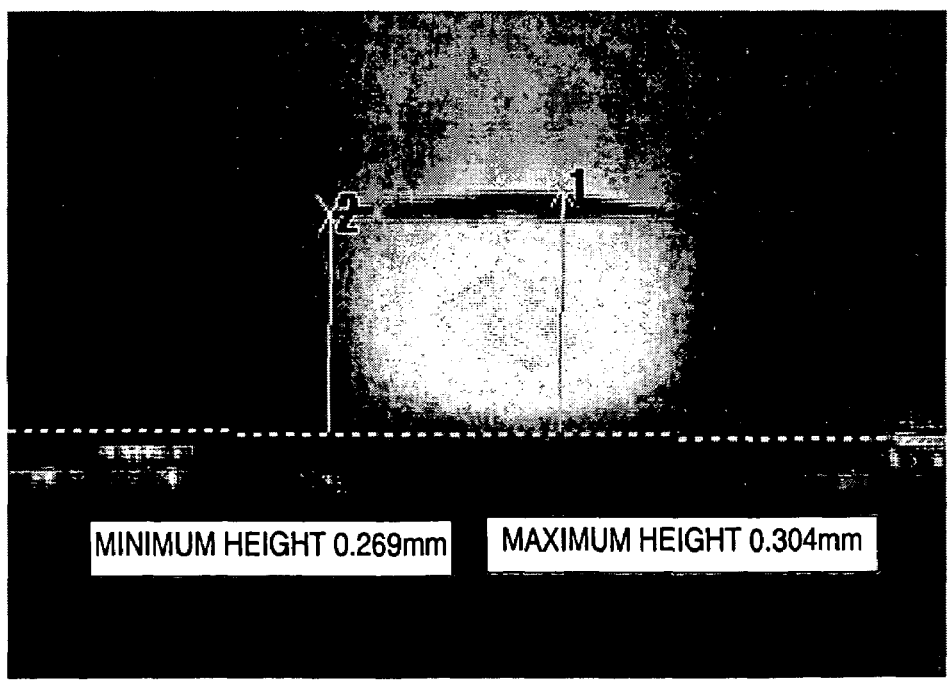

FIG. 7A is a photograph showing the appearance of an optical wavelength converting portion 13 made of a silicone resin, and FIG. 7B is a photograph showing the side surface of another optical wavelength converting portion 13 made of a silicone resin. The optical wavelength converting portion 13 shown in FIG. 7A substantially has the shape of a truncated cone, while the optical wavelength converting portion 13 shown in FIG. 7B has a substantially cylindrical shape. Each of these optical wavelength converting portions 13 has a concave curved surface portion on its side surface. In FIG. 7B, the "minimum height" and "maximum height" of the optical wavelength converting portion 13 are also described. If an optical wavelength converting portion with an average thickness of less than 0.5 mm is made of a resin, then the resin thickness changes from one position to another as shown in FIG. 7B and the height of the upper surface of the optical wavelength converting portion as measured from the principal surface of the substrate may be variable, which does not cause a particularly serious problem, though.

In this manner, on the side surface (and upper surface) of the optical wavelength converting portion 13 of this preferred embodiment, the concave curved surface portion is provided on purpose. The present inventors discovered and confirmed via experiments and computer simulations that the presence of this curved surface increased not only the optical efficiency but also the luminous flux as well.

Now, it will be considered how large the radius of curvature of the cross-sectional shape shown in FIG. 2 should be to define this curved surface. This radius of curvature is calculated on a profile of the optical wavelength converting portion 13, which is taken across the side surface thereof (i.e., that portion of the side surface with the concave portion) and viewed on a plane perpendicular to the principal surface of the substrate 11. The profile of the optical wavelength converting portion 13 shown in FIG. 2 shows the curves that define the concave curved surface portion of the side surface. In this case, an R/t ratio, obtained by dividing the radius of curvature R of the curves by the thickness t of the optical wavelength converting portion 13, is preferably from 0.5 to 8.5. The reasons are as follows. Specifically, if the R/t ratio exceeded 8.5, there would be substantially no difference between the conventional LED lamp, in which no concave curved surface portion is formed on the side surface of the optical wavelength converting portion 13, and the LED lamp of this preferred embodiment. However, if the R/t ratio were less than 0.5, then the optical efficiency would rather decrease. More preferably, this R/t ratio falls within the range of 1.1 to 3.7.

Also, a d/t ratio, obtained by dividing the depth d of the concave curved surface portion on the side surface of the optical wavelength converting portion 13 by the thickness t of the optical wavelength converting portion 13, is preferably from 0.03 to 0.5. The thickness t never changes by more than one order of magnitude from one LED lamp to another. Thus, in a typical LED lamp, the depth d of the concave portion on the side surface of the optical wavelength converting portion 13 preferably falls within the range of 0.01 mm to 0.17 mm.

The curves shown in FIG. 2 do not have to be complete arcs but are preferably gentle curves with no inflection points. However, even if there were some protrusions or recesses on the side surface of the optical wavelength converting portion, there would be no problem as long as the curved surface can be regarded as "concave" as a whole.

First Preferred Manufacturing Method

Hereinafter, a first preferred method for manufacturing an LED lamp according to a preferred embodiment of the present invention will be described with reference to FIGS. 8A through 8E.

Figure 8A:
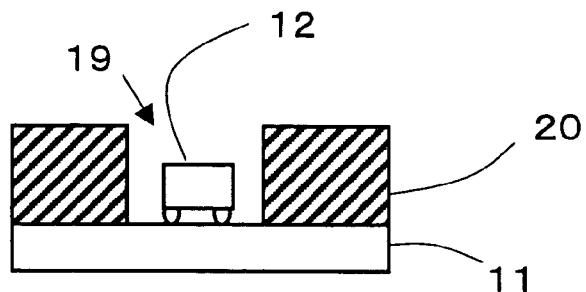
FIGS. 8A through 8E are cross-sectional views illustrating a first preferred method for manufacturing LED lamps according to a preferred embodiment of the present invention.
Figure 9:
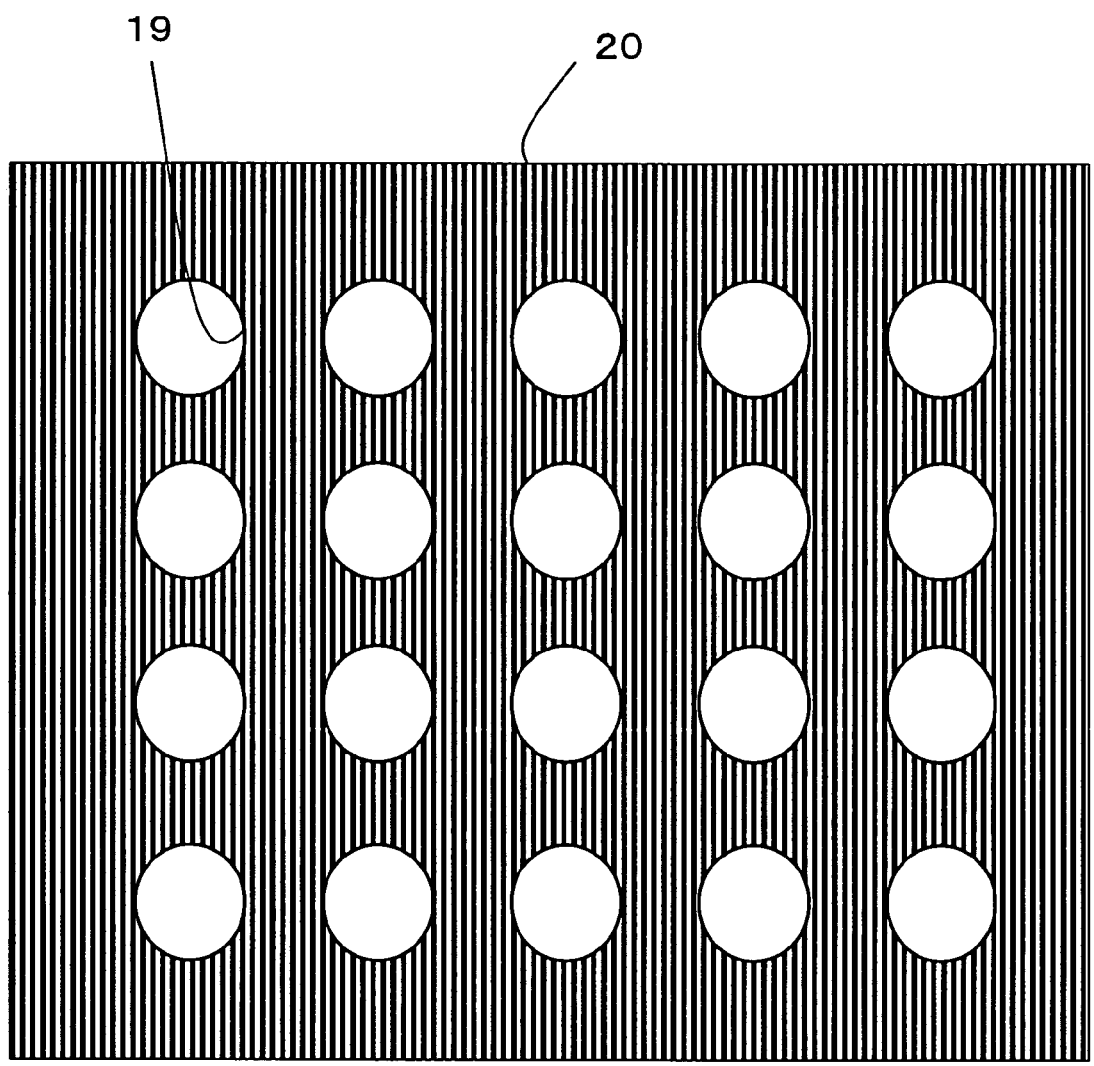
FIG. 9 is a plan view illustrating a printing stencil that can be used effectively in a preferred embodiment of the present invention.

First, as shown in FIG. 8A, a printing stencil 20 is put on the principal surface of a substrate 11 on which LED chips 12 have been mounted. The printing stencil 20 is a plate member with a plurality of openings 19 as shown in FIG. 9. Each of these openings 19 has its location and shape defined so as to surround an associated one of the LED chips 12 on the substrate 11. In the printing stencil shown in FIG. 9, each of those openings 19 is defined by a cylindrical space.

Figure 8B:
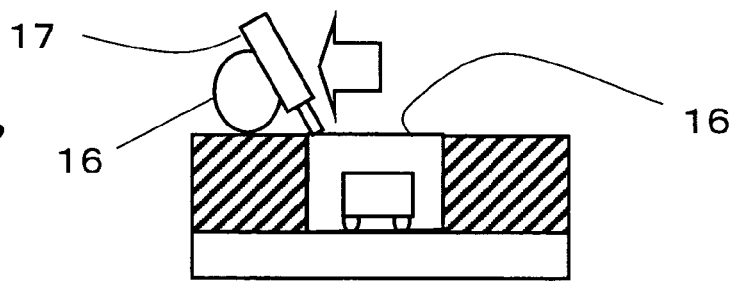

Next, as shown in FIG. 8B, a resin including a phosphor (which will be referred to herein as a "phosphorescent resin" 16) is supplied onto the printing stencil 20, and the upper surface of the printing stencil 20 is scanned with this phosphorescent resin 16 pressed with a squeeze 17. As a result, the openings 19 of the printing stencil 20 are filled with the phosphorescent resin 16.

Figure 8C:
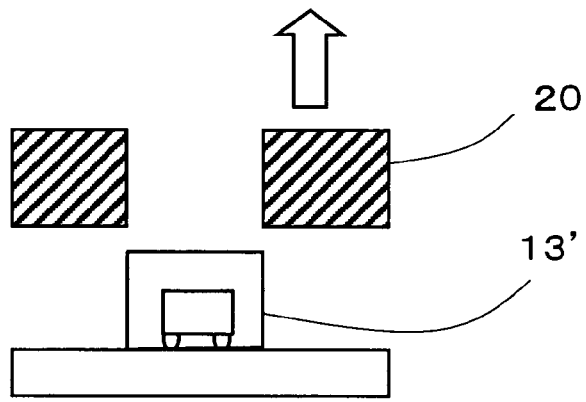
Figure 8D:
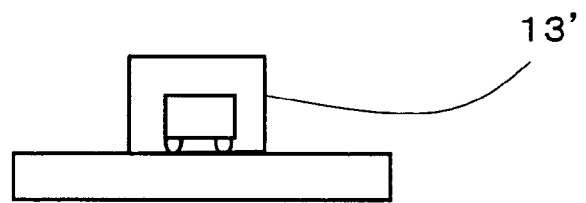

In this preferred embodiment, the phosphorescent resin 16 is made of a resin material with high viscosity. For that reason, when the printing stencil 20 is removed from the substrate 11 as shown in FIG. 8C, a resin pattern 13' of the phosphorescent resin 16 is formed on the substrate 11 as shown in FIG. 8D. The resin pattern 13' will eventually define optical wavelength converting portions 13 but its side surfaces have no concave curved surface portions yet at this point in time.

Figure 8E:
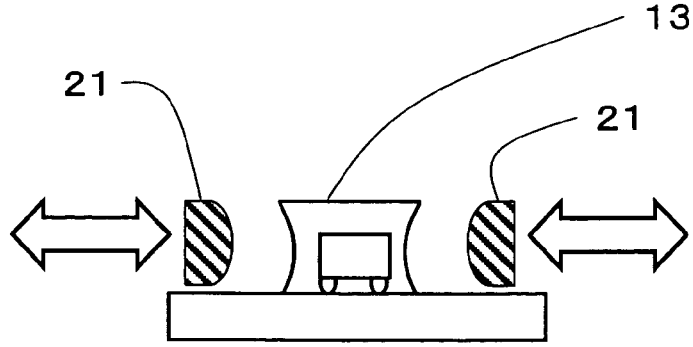

Next, in this preferred embodiment, each side surface of the resin pattern 13' is pressed with a pressing member 21, thereby recessing the side surface of the resin pattern 13' to form a concave curved surface portion there as shown in FIG. 8E. In this manner, optical wavelength converting portions 13, each including the concave curved surface portion on its side surface, can be obtained.

When each side surface of the resin pattern 13' is pressed, its upper surface may sometimes be deformed, too, to define a downwardly recessed concave curved surface portion there. In this preferred embodiment, the resin pattern 13' is cured after the printing stencil 20 has been removed from the substrate 11. However, the curing timing and condition may be optimized according to the type of the resin adopted.

Second Preferred Manufacturing Method

Hereinafter, a second preferred method for manufacturing an LED lamp according to another preferred embodiment of the present invention will be described with reference to FIGS. 10A through 10D.

Figure 10A:
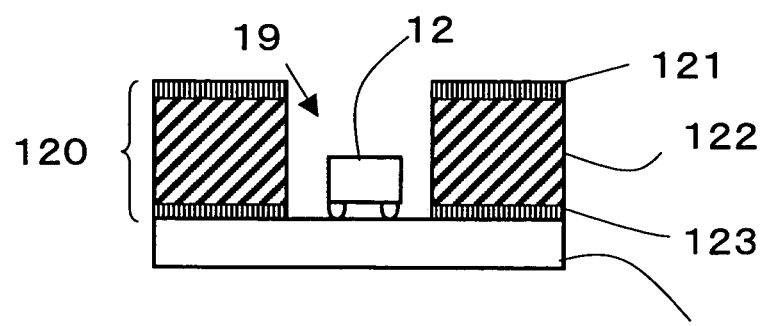
FIGS. 10A through 10D are cross-sectional views illustrating a second preferred method for manufacturing LED lamps according to another preferred embodiment of the present invention.

First, as shown in FIG. 10A, a printing stencil 120 is put on the principal surface of a substrate 11 on which LED chips 12 have been mounted. The upper surface of the printing stencil 120 is similar to that of the printing stencil 20 shown in FIG. 9. However, the cross-sectional structure of the printing stencil 120 for use in this preferred embodiment is quite different from that of the printing stencil 20. More specifically, the printing stencil 120 includes two plates 121 and 123 made of a relatively high-rigidity material such as a metal and an elastic layer 122 made of highly elastic rubber, which is sandwiched between these two plates 121 and 123. Just like the printing stencil 20 described above, the printing stencil 120 also has a plurality of openings (or through holes) 19.

Figure 10B:
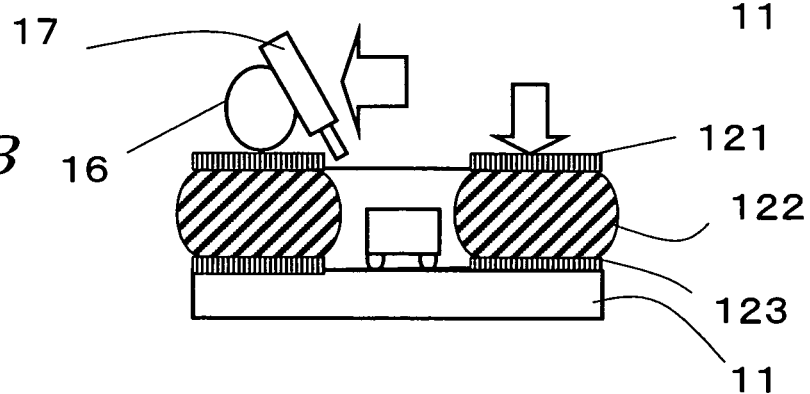

Next, as shown in FIG. 10B, a phosphorescent resin 16 is supplied onto the printing stencil 120, and the upper surface of the printing stencil 120 is scanned with this phosphorescent resin 16 pressed with a squeeze 17. In this process step, the pressure is applied vertically to the printing stencil 120, thereby compressing the elastic layer 122 in the thickness direction and raising the side surface of each of those openings 19 toward the center of that opening. In such a state, the phosphorescent resin 16 is supplied into the openings 19, thereby filling the openings 19 of the printing stencil 120 with the phosphorescent resin 16.

Figure 10C:
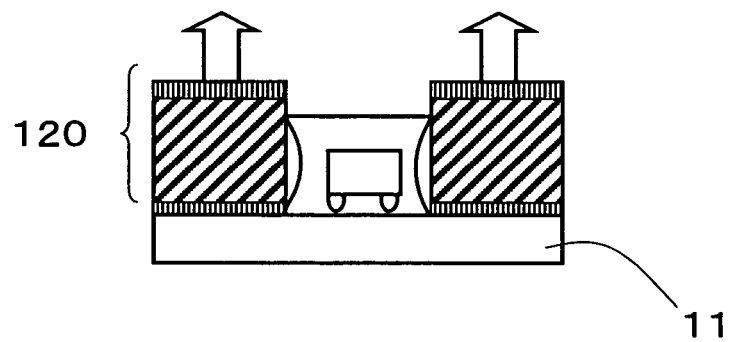
Figure 10D:
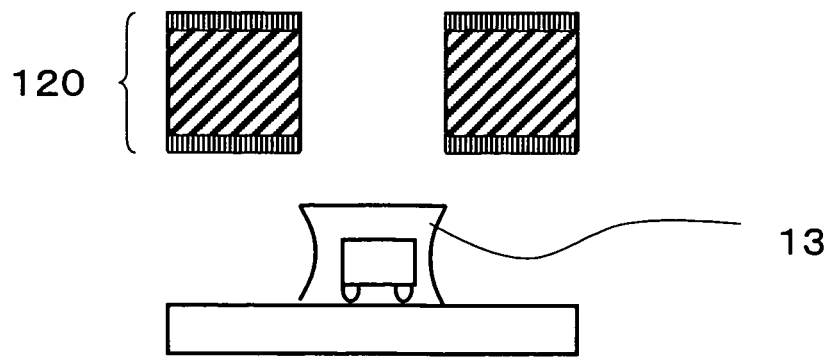

In this preferred embodiment, the phosphorescent resin 16 is also made of a resin material with high viscosity (e.g., a resin including silicone as its main ingredient). For that reason, when the printing stencil 120 is removed from the substrate 11 as shown in FIG. 10C, optical wavelength converting portions 13, each including a concave curved surface portion on its side surface, are formed on the substrate 11 as shown in FIG. 10D.

Figure 11A:
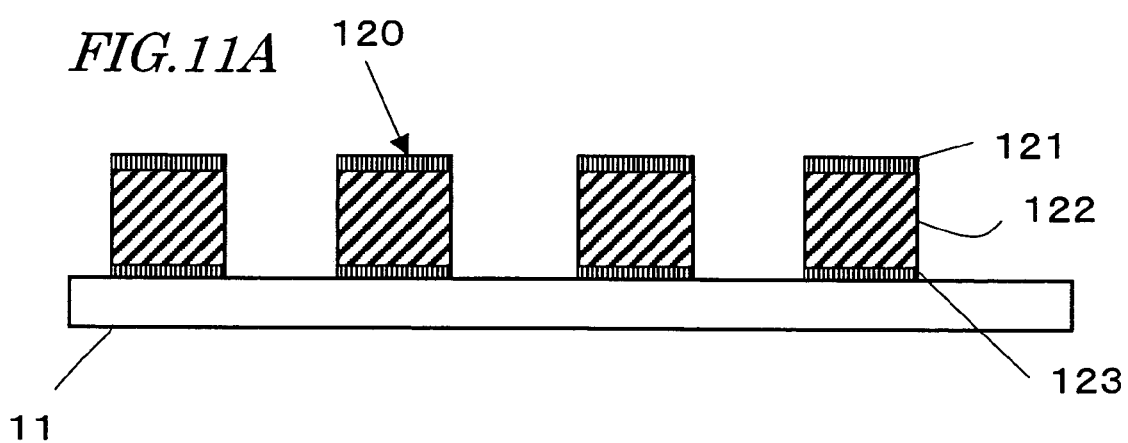
FIGS. 11A and 11B are cross-sectional views showing the configuration and operation of the printing stencil 120 shown in FIG. 10A.
Figure 11B:
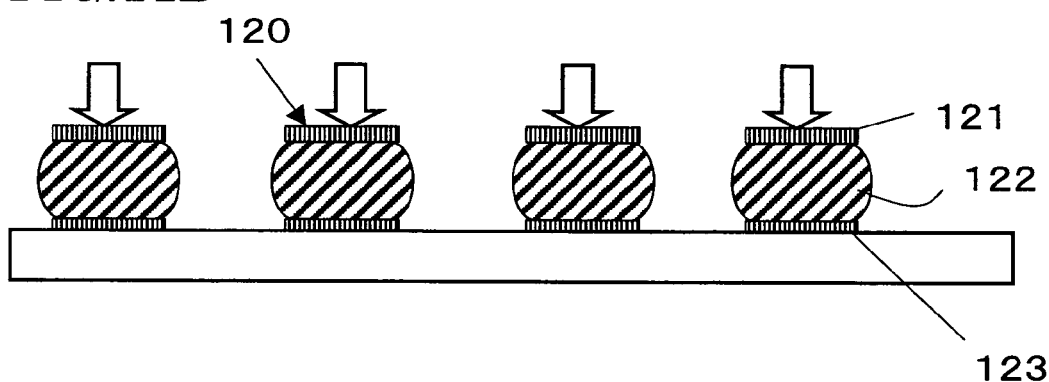
Figure 11C:
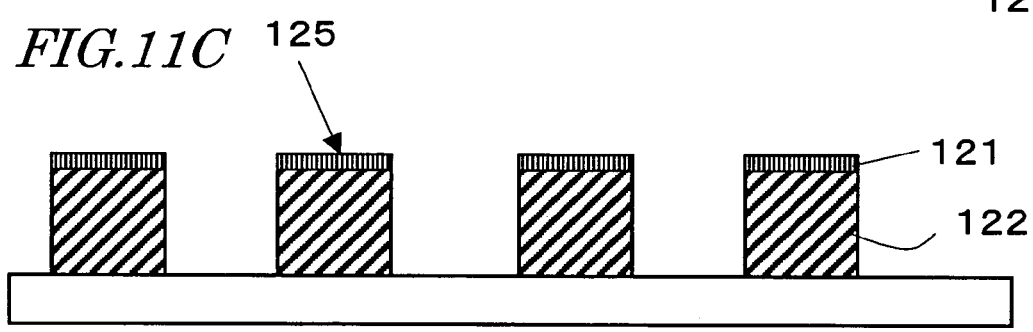
FIGS. 11C and 11D are cross-sectional views showing the configuration and operation of another printing stencil 125.
Figure 11D:
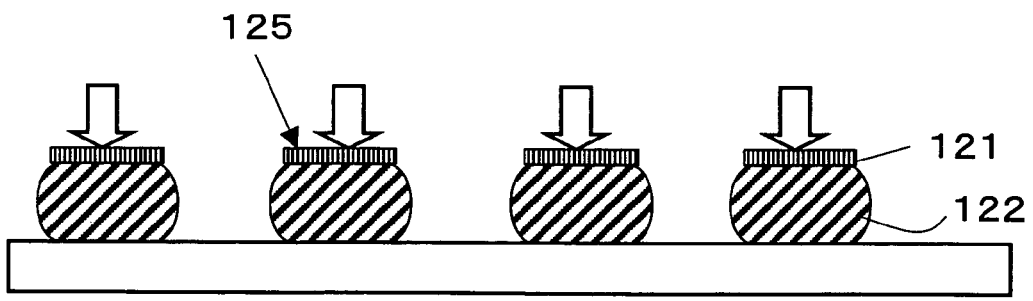

As shown in FIGS. 11A and 11B, in this preferred embodiment, the printing stencil 120 including, as its intermediate layer, an elastic layer (or member) made of rubber, for example, is used and the openings thereof are deformed with the application of pressure, thereby obtaining optical wavelength converting portions, each including a concave curved surface portion on its side surface. However, the present invention is in no way limited to those specific preferred embodiments. Alternatively, a two-layered printing stencil 125, including the high-rigidity plate 121 only on the upper surface of the elastic layer 122, may also be used as shown in FIGS. 11C and 11D.

As another alternative, a two-layered printing stencil, including the plate 121 only on the lower surface of the elastic layer 122, may also be used. Or even a printing stencil consisting of the elastic layer 122 only may also be used. Optionally, the printing stencil may also be a structure including a fluid in place of the elastic layer 122 so as to be deformable more easily or may be made of any other easily deformable material. The resin for use in the first and second preferred methods described above has a thermosetting property. Thus, the resin can be cured by being subjected to a heat treatment (e.g., kept heated at 120° C. for one hour) after the patterning process. Thereafter, the lens resin may be molded by a transfer molding process, for example.

It should be noted that the optical wavelength converting portions of the present invention do not have to be formed by the methods of the preferred embodiments described above but may also be formed by any other suitable method.

Hereinafter, the computer simulations, which were carried out on the luminous flux of an LED lamp according to a preferred embodiment of the present invention and on the luminous flux of a conventional LED lamp, will be described.

Figure 3:
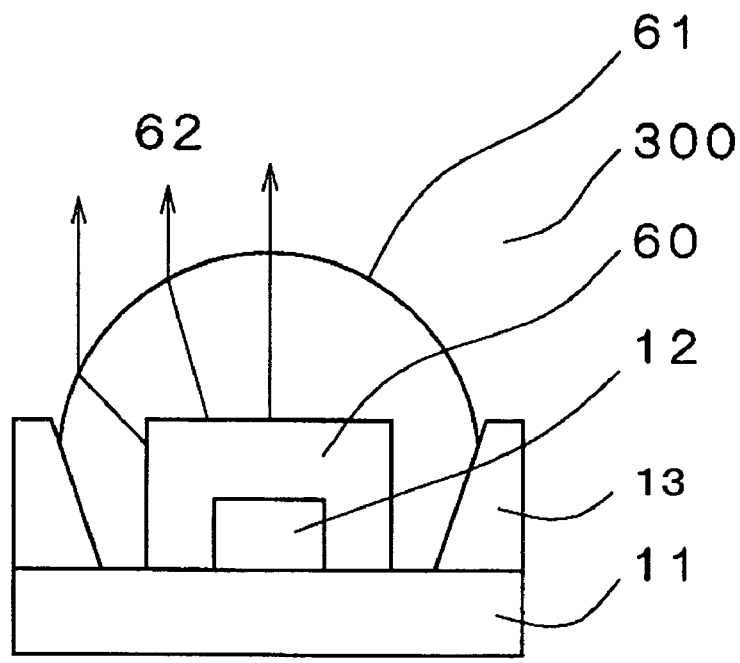
FIG. 3 is a schematic cross-sectional view illustrating a conventional LED lamp 300.

FIG. 3 illustrates a configuration for a conventional LED lamp. In the LED lamp 300 shown in FIG. 3, every component thereof, except the cylindrical resin portion 60, has the same structure as the counterpart of the LED lamp 100 of this preferred embodiment shown in FIG. 1. This cylindrical resin portion 60 is significantly different from the optical wavelength converting portion 13 of this preferred embodiment in the surface shape. Specifically, the conventional cylindrical resin portion 60 has a cylindrical shape, of which the bottom is in contact with the substrate 11 and the upper and side surfaces of which have no concave curved surface portions. It should be noted that the side surface of the cylinder is a "curved surface" but is "convex", not "concave".

Simulation Results No. 1

The luminous flux of the LED lamp 100 was calculated by computer simulations, which were carried out on the following conditions:

The substrate 11 had a reflectance of 0.5;
The reflector 14 had a reflectance of 0.82;
The optical wavelength converting portion 13 had a uniform luminous flux per unit surface area (i.e., the same luminous flux density) in every direction;
The optical wavelength converting portion 13 had a refractive index n1 of 1.4;
The cover member 15 had a refractive index n2 of 1.6;
The cover member 15 was formed in a hemispheric shape;
The cover member 15 had a transmittance of 96%/mm; and
The total number of rays radiated through the surface of the optical wavelength converting portion 13 was approximately 200,000 (on the supposition that the first resin portion was a light source).

Also, the optical wavelength converting portion 13 was formed in the following four shapes:

Shape No. 1: substantially truncated cone with concave curved surface portions provided on both the upper and side surfaces thereof (as shown in FIG. 2);

Shape No. 2: substantially truncated cone with a concave curved surface portion provided only on the upper surface 131 thereof (not shown);

Shape No. 3: substantially truncated cone with a concave curved surface portion provided only on the side surface 132 thereof (not shown); and Shape No. 4 (comparative example): truncated cone with no concave portions at all (i.e., a structure obtained by replacing the cylindrical resin portion 60 shown in FIG. 3 with a truncated cone resin portion).

On these conditions, the luminous flux of the LED lamp 100 was calculated. The luminous flux values calculated were normalized with the luminous flux of the comparative example represented by Shape No. 4 supposed to be 100%. The normalized luminous fluxes are shown in the following Table 1:

TABLE 1

| | Shape No. 1 | Shape No. 2 | Shape No. 3 | Shape No. 4 |
|---|---|---|---|---|
| Luminous flux calculated | 110% | 103% | 107% | 100% |

As can be seen from the results shown in Table 1, the luminous flux could be increased by providing the concave curved surface portion on the upper and/or side surfaces of the optical wavelength converting portion. Specifically, when the concave curved surface portion was provided only on the upper surface of the optical wavelength converting portion, the luminous flux increased by 3%. On the other hand, when the concave curved surface portion was provided only on the side surface of the optical wavelength converting portion, the luminous flux increased by 4%. And when the concave curved surface portions were provided on both the upper and side surfaces of the optical wavelength converting portion, the luminous flux increased by as much as 10%.

Simulation Results No. 2

On almost the same conditions as those adopted for the simulations described above, a virtual emission point was defined within the optical wavelength converting portion 13 and the luminous flux of the light, which was supposed to be radiated isotropically from that emission point, was calculated as the luminous flux of the LED lamp. The luminous flux values calculated were also normalized with the luminous flux of the comparative example represented by Shape No. 4 supposed to be 100%.

The simulations were carried out on the same conditions as those adopted to obtain simulation results No. 1 except that:

The number of rays at each emission point was approximately 200,000; and

Figure 4:
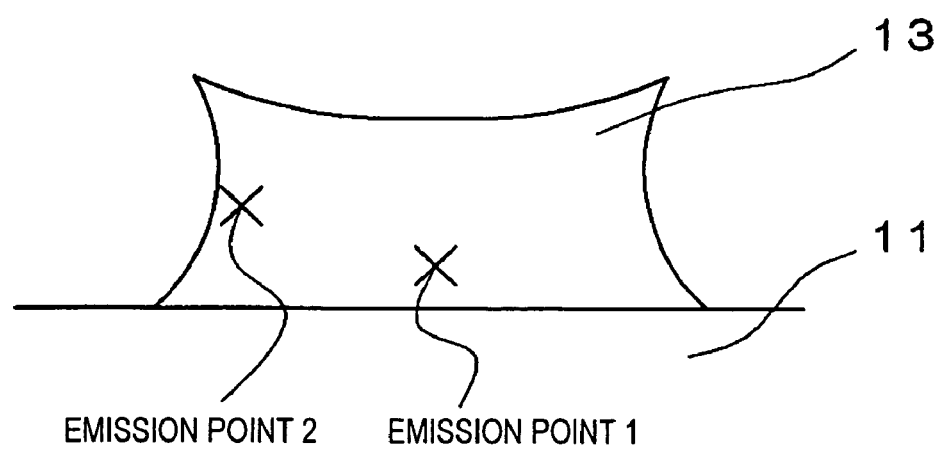
FIG. 4 is a schematic representation showing where emission points are defined to obtain results of simulations.

Two emission points were defined at the center of the optical wavelength converting portion 13 and near the side surface of the optical wavelength converting portion 13, respectively, as shown in FIG. 4.

The results of the simulations are shown in the following Table 2:

TABLE 2

|  | Shape #1 | Shape #2 | Shape #3 | Shape #4 |
|---|---|---|---|---|
| Luminous flux at Emission point 1 | 106% | 101% | 104% | 100% |
| Luminous flux at Emission point 2 | 103% | 103% | 101% | 100% |

As can be seen from the results shown in Table 2, no matter where the virtual emission point was defined within the optical wavelength converting portion 13, the luminous flux could be increased by providing the concave curved surface portion on at least one of the side and upper surfaces of the optical wavelength converting portion 13.

Analysis of the Simulation Results

Hereinafter, these simulations results will be analyzed.

If the light radiated from the optical wavelength converting portion 13 (with a refractive index n1 of 1.41) enters the cover member 15 (with a refractive index n2 of 1.55) (i.e., when n1<n2 is satisfied), then there is no critical angle or no total reflection. In that case, all of the light radiated from the optical wavelength converting portion 13 is transmitted through the cover member 15 and no light is lost at the interface between the optical wavelength converting portion 13 and cover member 15.

If there is at least one concave curved surface portion between the optical wavelength converting portion 13 and the cover member 15 as in the preferred embodiment described above, a lens effect is produced at the interface. The present inventors believe that the light radiated from the optical wavelength converting portion 13 would be converged to a larger degree, the amount of stray light in the cover member 15 would decrease, and the resultant luminous flux would increase probably for this reason. This is because when the amount of stray light in the cover member 15 decreases, the light can be extracted from the cover member 15 more efficiently and the luminous flux of the LED lamp increases as a result.

As described above, by providing the concave curved surface portion on the side surface of the optical wavelength converting portion 13, the light extraction efficiency can be increased effectively.

In the preferred embodiment described above, the refractive indices n1 and n2 of the optical wavelength converting portion 13 and cover member 15 satisfy the inequality n1<n2. However, even if n1>n2 were satisfied, the concave curved surface portion provided on the side surface of the optical wavelength converting portion could still increase the light extraction efficiency. In that case, there would be a critical angle, and therefore, the shapes of the optical wavelength converting portion 13 and cover member 15 should be optimized with the n1/n2 ratio taken into account.

In the preferred embodiment described above, the optical wavelength converting portion 13 has a substantially truncated cone shape. However, the optical wavelength converting portion 13 does not have to have such a shape. Rather, the light extraction efficiency can be increased effectively as long as the side surface of the optical wavelength converting portion 13 has a concave curved surface portion in any other shape.

It should be noted that if the distance from the center of the LED chip 12 to a point on the outer circumference of the optical wavelength converting portion 13 including the phosphor is almost equal to the distance from that center of the LED chip 12 to any other point on the same circumference of the optical wavelength converting portion 13 as measured substantially parallel to the substrate 11, then the wavelength conversion is done substantially uniformly by the phosphor in the optical wavelength converting portion 13. As a result, the radiation from the phosphor can be highly uniform and the color unevenness of the radiation produced by the LED lamp 100 can be reduced. Exemplary shapes of such an optical wavelength converting portion 13 are illustrated in FIGS. 5 and 6. The illustration of the cover member 15 and reflector 14 is omitted from FIGS. 5 and 6 for the sake of simplicity.

Figure 5A:
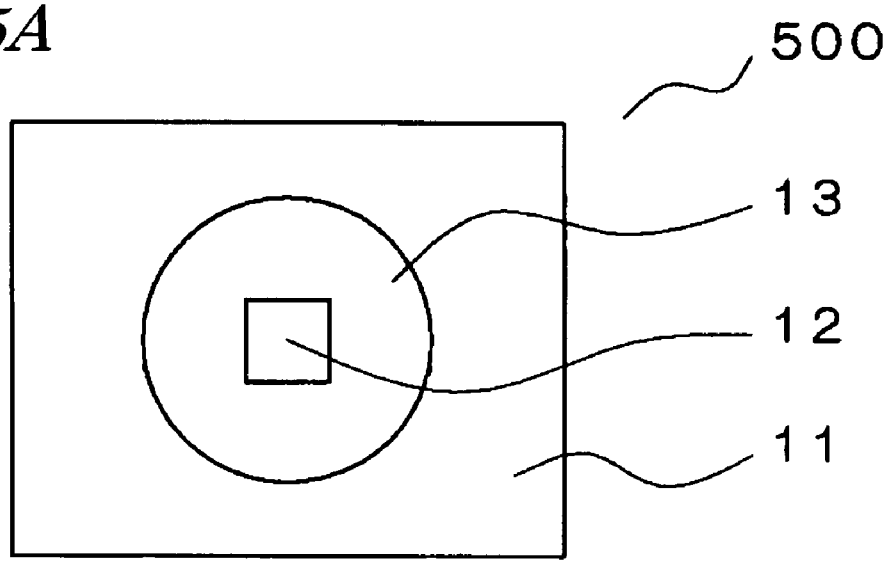
FIGS. 5A and 5B are respectively a top view and a cross-sectional view illustrating an exemplary shape of the optical wavelength converting portion 13.
Figure 5B:
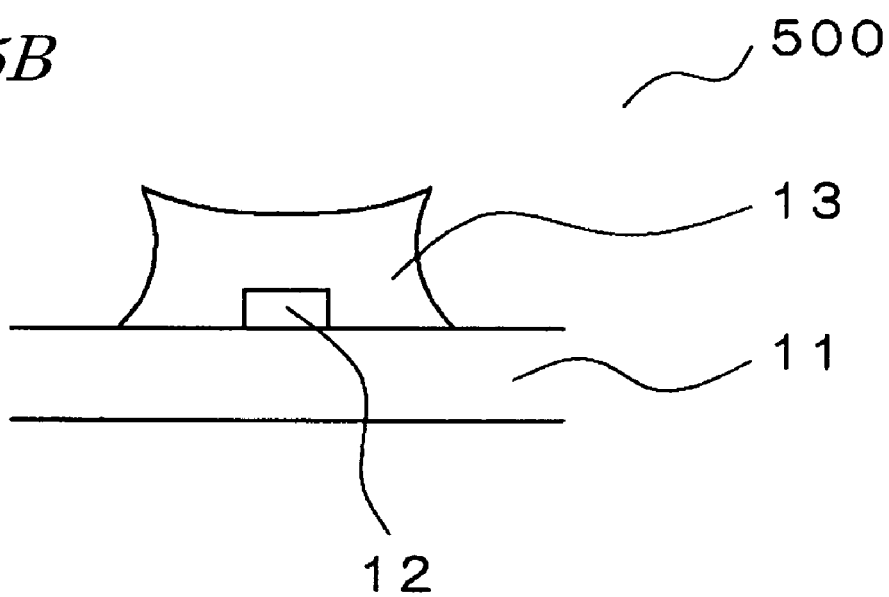

FIG. 5A is a schematic top view of an LED lamp 500 and FIG. 5B is a schematic side view thereof. In the LED lamp 500, the optical wavelength converting portion 13 has a substantially cylindrical shape with concave curved surface portions provided on the upper and side surfaces thereof.

Figure 6A:
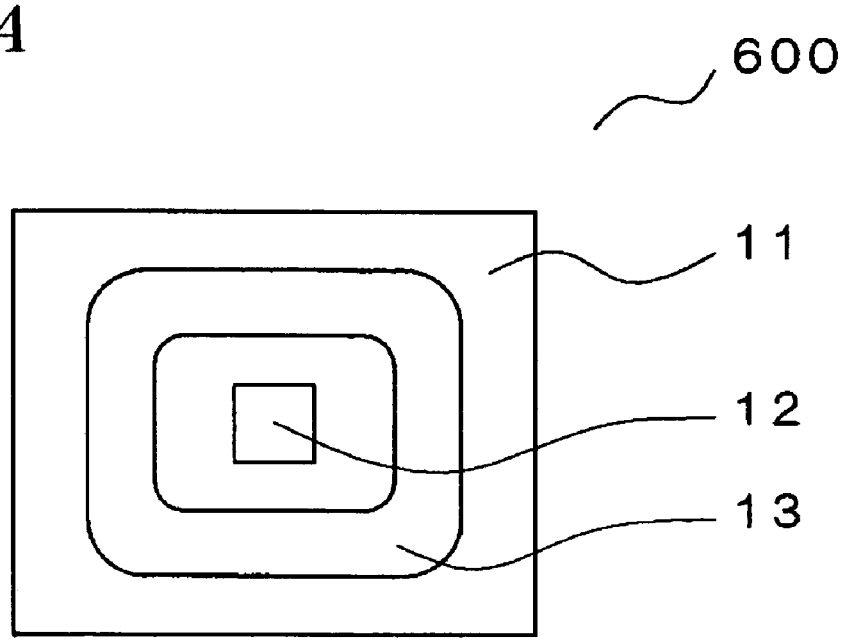
FIGS. 6A and 6B are respectively a top view and a cross-sectional view illustrating another exemplary shape of the optical wavelength converting portion 13.
Figure 6B:
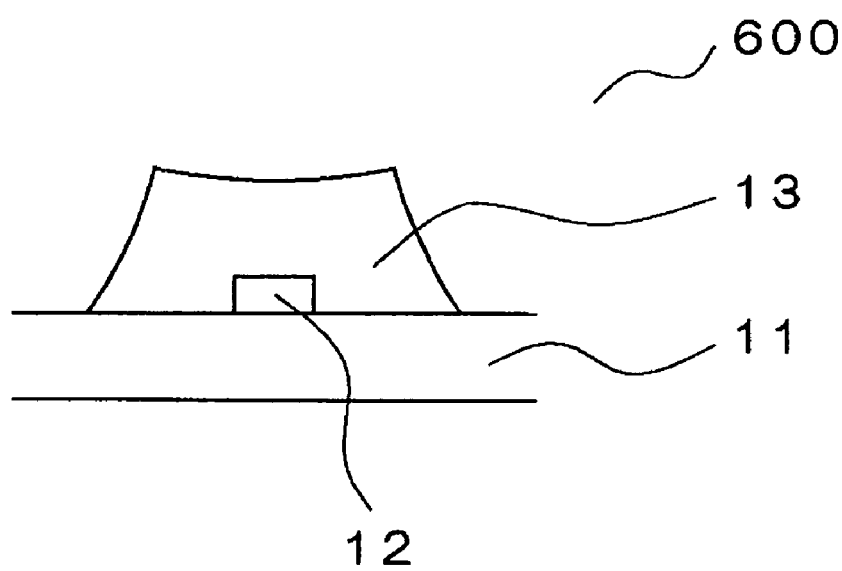

FIG. 6A is a schematic top view of an LED lamp 600 and FIG. 6B is a schematic side view thereof. In the LED lamp 600, the optical wavelength converting portion 13 has a substantially truncated pyramid shape with rounded hypotenuse corners, and concave curved surface portions are also provided on the upper and side surfaces of the optical wavelength converting portion 13.

The basic shapes of optical wavelength converting portions according to various preferred embodiments of the present invention are not limited to those mentioned above but also include a substantially truncated pentagonal pyramid shape and a substantially truncated hexagonal pyramid shape. In any case, the LED chip 12 is preferably arranged substantially at the center of almost the bottom of the optical wavelength converting portion 13.

Generally speaking, the larger the ratio of the total area of the concave curved surface portions to the overall surface area of the optical wavelength converting portion 13, the higher the light extraction efficiency can be. For that reason, the concave curved surface portions preferably account for a highest possible percentage of the overall surface area of the optical wavelength converting portion 13.

In the preferred embodiment described above, the cover member 15 functions as a convex lens. However, the cover member 15 may also have any other shape as long as the cover member 15 can achieve optical functions as required in various applications by taking advantage of its convex lens structure.

Also, in the preferred embodiment described above, the reflector 14 is provided on the principal surface of the substrate 11. Alternatively, a reflective surface may be defined directly on the principal surface of the substrate. Any arbitrary reflective structure may be used as long as that structure can increase the directivity of the outgoing bundle of rays.

Furthermore, in the preferred embodiment described above, the optical wavelength converting portion 13 is made of a resin material including a silicone resin as its main ingredient and the cover member 15 is made of a resin material including an epoxy resin as its main ingredient. However, the optical wavelength converting portion 13 or cover member 15 may also be made of any other material.

To minimize the color unevenness, the center of the LED chip 12 is preferably matched with that of the optical wavelength converting portion 13. And to increase the light extraction efficiency and further reduce the unevenness of the light radiated from the LED lamp, the respective centers of the LED chip 12, the optical wavelength converting portion 13, the opening of the reflector 14, and the cover member 15 are preferably all matched together.

An LED lamp according to any of various preferred embodiments of the present invention described above achieves such a high light extraction efficiency as to be used effectively as a light source for a lighting unit and various other types of units.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2003-333211 filed Sep. 25, 2003 and No. 2004-246944 filed Aug. 26, 2004, the entire contents of which are hereby incorporated by reference.

What is claimed is:

1. An LED lamp comprising:
   at least one LED chip mounted on the principal surface of a substrate; and
   an optical wavelength converting portion, which includes a phosphor for converting the emission of the LED chip into light having a longer wavelength than that of the emission and which covers at least a portion of the LED chip,
   wherein the optical wavelength converting section has an upper surface and a side surface and the side surface of the optical wavelength converting portion has at least one concave curved surface portion which is recessed toward the LED chip.

2. The LED lamp of claim 1, further comprising a cover member that covers at least a part of the optical wavelength converting portion.

3. The LED lamp of claim 1, further comprising:
   a reflective surface, which is spaced apart from the side surface of the optical wavelength converting portion; and
   a cover member that covers at least a part of the optical wavelength converting portion,
   wherein the refractive index of the cover member is different from that of the optical wavelength converting portion.

4. The LED lamp of claim 3, wherein the refractive index of the cover member is greater than that of the optical wavelength converting portion.

5. The LED lamp of claim 4, wherein the cover member is made of a resin, and
   wherein the cover member fills a gap between the side surface of the optical wavelength converting portion and the reflective surface.

6. The LED lamp of claim 3, wherein the cover member functions as a lens.

7. The LED lamp of claim 1, wherein the optical wavelength converting portion is made of a resin including the phosphor.

8. The LED lamp of claim 1, wherein the optical wavelength converting portion is in the form of revolution having concave sides.

9. The LED lamp of claim 1, wherein the optical wavelength converting portion substantially has the shape of a truncated cone, of which the side surface defines the concave curved surface portion.

10. An LED lamp comprising:
    at least one LED chip mounted on the principal surface of a substrate; and
    an optical wavelength converting portion, which includes a phosphor for converting the emission of the LED chip into light having a longer wavelength than that of the emission and which covers at least a portion of the LED chip,
    wherein a side surface of the optical wavelength converting portion has at least one concave curved surface portion, and
    wherein as viewed on a plane perpendicular to the principal surface of the substrate, a cross section of the optical wavelength converting portion, taken across the concave curved surface portion of its side surface, has a profile including a curve that defines the concave curved surface portion, and
    wherein $R/t$, obtained by dividing the radius of curvature $R$ of the curves by the thickness $t$ of the optical wavelength converting portion from the top of the wavelength converting section to the substrate is from 0.5 to 8.5.

11. An LED lamp comprising:
    at least one LED chip mounted on the principal surface of a substrate; and
    an optical wavelength converting portion, which includes a phosphor for converting the emission of the LED chip into light having a longer wavelength than that of the emission and which covers at least a portion of the LED chip,
    wherein a side surface of the optical wavelength converting portion has at least one concave curved surface portion, and
    wherein $d/t$, obtained by dividing the depth $d$ of the concave curved surface portion on the side surface of the optical wavelength converting portion by the thickness $t$ of the optical wavelength converting portion from the top of the wavelength converting section to the substrate is from 0.03 to 0.5.

12. The LED lamp of claim 11, wherein the depth $d$ of the concave curved surface portion on the side surface of the optical wavelength converting portion is from 0.01 mm to 0.17 mm.

13. An LED lamp comprising:
    a plurality of LED chips, which are arranged on the principal surface of a substrate;
    a plurality of reflective surfaces, each of which surrounds the side surface of an associated one of the LED chips;
    a plurality of optical wavelength converting portions having an upper surface and a side surface, each of which includes a phosphor for converting the emission of its associated LED chip into light having a longer wavelength than that of the emission and which covers the associated LED chip; and
    a plurality of cover members, each of which covers an associated one of the optical wavelength converting portions,
    wherein the side surface of each said optical wavelength converting portion has at least one concave curved surface portion which recessed toward the LED chip, and wherein each said cover member fills a gap between the side surface of its associated optical wavelength converting portion and its associated reflective surface.

14. A method for manufacturing an LED lamp, the method comprising the steps of:
- (A) mounting at least one LED chip on the principal surface of a substrate; and
- (B) providing an optical wavelength converting portion having an upper surface and a side surface on the substrate, the optical wavelength converting portion including a phosphor that converts the emission of the LED chip into light having a longer wavelength than that of the emission and covering at least a portion of the LED chip, wherein the step (B) includes the step of forming at least one concave curved surface portion on the side surface of the optical wavelength converting portion which is recessed toward the LED chip.

15. The method of claim 14, wherein the step (B) includes the steps of:
- (b1) providing an isolated pattern of the material of the optical wavelength converting portion on the substrate; and
- (b2) forming the concave curved surface portion by deforming the side surface of the isolated pattern.

* * * * *